(12) United States Patent
Warrick

(10) Patent No.: US 6,375,088 B1
(45) Date of Patent: Apr. 23, 2002

(54) FLUID DELIVERY DEVICE WITH PULSATING LINEAR DISCHARGE AND FLUID CLEANING METHOD

(75) Inventor: Dean A. Warrick, Endicott, NY (US)

(73) Assignee: International Business Machines Corp., Armonk, NY (US)

( * ) Notice: Subject to any disclaimer, the term of this patent is extended or adjusted under 35 U.S.C. 154(b) by 0 days.

(21) Appl. No.: 09/372,420

(22) Filed: Aug. 11, 1999

(51) Int. Cl.[7] ................................................ B05B 17/00
(52) U.S. Cl. ................................ 239/1; 239/8; 239/101; 239/214; 239/214.15; 239/214.17; 239/381; 239/419; 239/566; 134/36; 134/102.2; 134/DIG. 902
(58) Field of Search .......................... 239/1, 8, 101, 239/102.1, 214, 214.11, 214.13, 214.15, 214.17, 214.21, 222.11, 380–383, 398, 419, 433, 548, 562, 563, 566, 568; 134/36, 102.1, 102.2, DIG. 902

(56) References Cited

U.S. PATENT DOCUMENTS

| | | | |
|---|---|---|---|
| 3,358,930 A | * 12/1967 | Parr | ........................ 239/381 X |
| 4,079,891 A | 3/1978 | Kwan | |
| 4,209,132 A | * 6/1980 | Kwan | ......................... 239/381 |
| 4,512,514 A | 4/1985 | Elcott | |
| 4,813,602 A | 3/1989 | Corey | |
| 5,217,163 A | 6/1993 | Henshaw | |
| 5,374,312 A | * 12/1994 | Hasebe et al. | .......... 134/902 X |
| 5,435,885 A | 7/1995 | Jones et al. | |
| 5,507,436 A | 4/1996 | Ruttenberg | |
| 5,850,973 A | 12/1998 | Liljeqvist et al. | |

* cited by examiner

Primary Examiner—Steven J. Ganey
(74) Attorney, Agent, or Firm—Ratner & Prestia; Arthur J. Samodovitz, Esq.

(57) ABSTRACT

A fluid delivery device providing a pulsating discharge. The device comprises a housing having an elongated chamber, a fluid inlet passage to the chamber, and a cylindrical rotor mounted in the chamber and comprising a plurality of grooves. The inlet passage comprises a first fluid injection channel through which the fluid enters the chamber and impinges upon the grooves in the rotor. The fluid thereby rotates the rotor and exits as a fluid pulse through a linear fluid discharge. The grooves in the rotor may be helical such that the pulse of fluid traverses the linear fluid discharge from one portion to another or sequences through a linearly aligned plurality of fluid exits. The device may further comprise a second fluid inlet passage adapted to inject a second fluid into the grooves. One fluid may be compressible and one non-compressible. A method for cleaning an object, such as a circuit board, using the fluid delivery device of the present invention is also disclosed.

23 Claims, 3 Drawing Sheets

FLUID DELIVERY DEVICE WITH PULSATING LINEAR DISCHARGE AND FLUID CLEANING METHOD

TECHNICAL FIELD

The present invention relates generally to fluid delivery devices and, more specifically, to a fluid delivery device providing a pulsating discharge and to a cleaning method using such a device.

BACKGROUND OF THE INVENTION

In various cleaning operations, such as the cleaning of circuit boards, a fluid, which may be a solvent for the contamination to be removed, is discharged and sprayed upon the area to be cleaned to contact the contamination. Often, such fluid is discharged in a steady stream that impacts the surface with a constant force. In many cases, the steady pressure of such a constant fluid stream and the solvent properties of the fluid are adequate to remove the contamination. The cleaning fluid is recycled in many applications.

As the use of chemical-based and petroleum-based solvents has become environmentally undesirable, cost-prohibitive, or both, more cleaning applications are being performed with water or aqueous cleaning fluids. Water or aqueous cleaning fluids often require added mechanical action, however, to provide the same cleaning ability as provided by chemical-based or petroleum-based solvents. Water conservation is also desirable not only to restrict water consumption, but also to limit waste treatment costs.

For any of the above reasons, it may be preferable to provide a pulsating stream of cleaning fluid aimed at the surface to be cleaned. Furthermore, in some applications the object to be cleaned, such as a circuit board, has a certain width and is moved past the cleaning device. In such applications it may be useful to provide the pulsating stream in the form of a sheet or curtain of discharged fluid. Although there are many ways known in the art for providing pulsating action in general, the present invention proposes a design that is particularly useful for providing a pulsating spray of liquid for cleaning circuit boards.

The deficiencies of the conventional fluid delivery devices show that a need still exists for an improved fluid delivery device and for a cleaning method using an improved device. To overcome the shortcomings of the conventional devices and methods, a new fluid delivery device and cleaning method are provided. An object of the present invention is to meet the requirements of those cleaning applications limited to in water or aqueous cleaning fluids. A related object is to provide a device and method having a cleaning ability comparable to that achieved by devices and methods using chemical-based or petroleum-based solvents. Another object is to provide a device and method offering water conservation. Still another object of the present invention is to provide a device and method that use a pulsating spray of liquid for cleaning circuit boards.

SUMMARY OF THE INVENTION

To achieve these and other objects, and in view of its purposes, the present invention provides a fluid delivery apparatus for supplying a linear pulsating discharge of a first fluid from a source of the first fluid. The apparatus comprises a housing, an elongated cylindrical chamber within the housing, an elongated cylindrical rotor rotatably mounted in the chamber and having a plurality of grooves, and a linear fluid discharge in the housing connected to the chamber. A first fluid injector passage in the housing is connected to the source of the first fluid and the chamber, and comprises a first fluid injection channel. The channel is shaped to accelerate the first fluid and to direct the accelerated fluid into the grooves of the rotor, causing the rotor to rotate. The rotor has an outside diameter sized to substantially wipe the inside diameter of the chamber. The linear fluid discharge may comprise a plurality of individual, linearly aligned orifices.

The grooves in the rotor may be helical and aligned with one linear portion of the linear fluid discharge in one position of the rotor and aligned with another linear portion of the linear fluid discharge in another position of the rotor. The helical grooves are adapted to provide a pulse of fluid that traverses the linear fluid discharge from one linear portion to the other upon rotation of the rotor from one position to the other. The rotor may comprise a first helical groove disposed in a clockwise helix and aligned with a first section of the linear fluid discharge and a second helical groove disposed in a counter-clockwise helix aligned with a second section of the linear fluid discharge.

The apparatus may comprise a second fluid injection channel in the housing connected to a source of a second fluid. The second fluid injection channel is adapted to inject the second fluid into the rotor grooves to be ejected through the linear fluid discharge. One of the first and second fluids may be a compressible fluid, such as air, and the other an incompressible fluid, such as water.

The invention also comprises a method for cleaning an object using the above apparatus. The method comprises (a) passing the first fluid into the first fluid injector passage and into the first fluid injection passage; (b) impinging the first fluid upon the grooves in the rotor, thereby rotating the rotor; and (c) ejecting a pulse of the first fluid through the linear fluid discharge onto the object, such as a circuit board. When the apparatus further comprises the second fluid injection channel, the method further comprises, between steps (b) and (c), injecting the second fluid into the second fluid injection channel and impinging the second fluid into the grooves in the rotor and, in step (c), ejecting the second fluid from the linear fluid discharge along with the first fluid.

When the grooves in the rotor are helical as described above, the method further comprises, in step (c), ejecting the fluid so that the pulse traverses the fluid discharge from one linear portion to the other linear portion as the rotor rotates from the one position to the other. When the linear fluid discharge comprises a plurality of individual orifices aligned linearly from a first orifice to a second orifice with a set of orifices in between, the method further comprises ejecting the first fluid in a pulse that sequences linearly from the first orifice through the set of orifices to the second orifice. The pulse may start at the center of the linear fluid discharge and end at the opposite ends, start at the opposite ends and end at the center, or travel from end to end.

It is to be understood that both the foregoing general description and the following detailed description are exemplary, but are not restrictive, of the invention.

BRIEF DESCRIPTION OF DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF INVENTION

Figure 1:
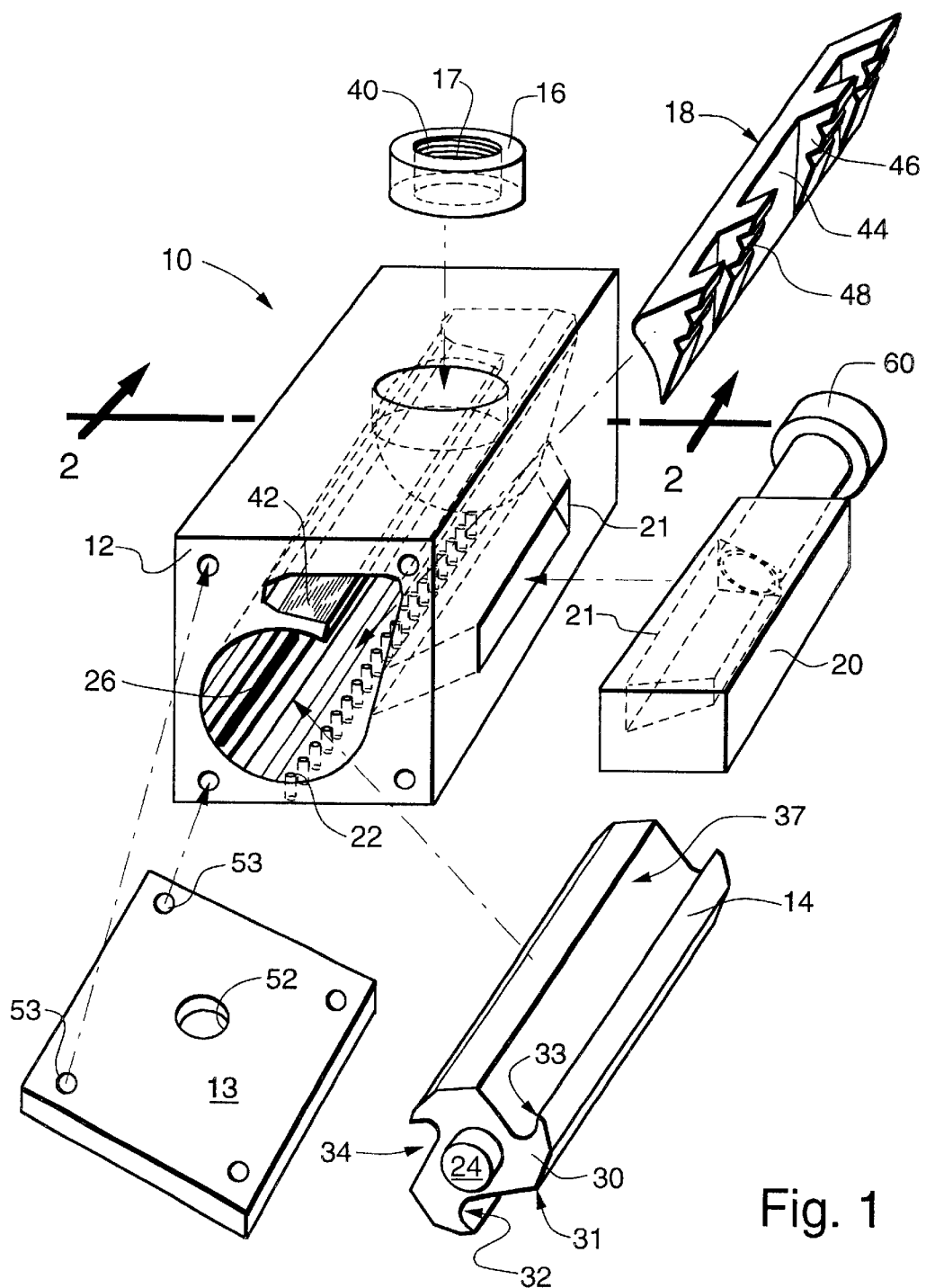
FIG. 1 is an exploded perspective view of an exemplary fluid delivery device of the present invention.
Figure 2:
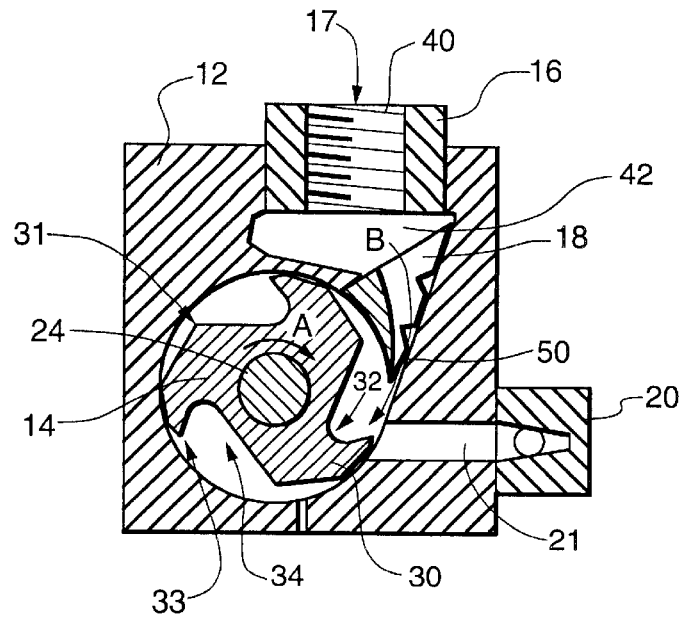
FIG. 2 is a cross-sectional view of the exemplary fluid delivery device (assembled) taken along plane 2—2 of FIG. 1.

Referring now to the drawing, wherein like reference numbers refer to like elements throughout, FIGS. 1 and 2 show the exemplary fluid delivery device, or "fluid head" 10 of the present invention. The exploded perspective view shown in FIG. 1 shows that fluid head 10 has several component parts: a housing 12, a rotor 14, a first fluid inlet nozzle 16, a flow distributor 18, and, optionally, a second fluid inlet block 20. Housing 12 has an elongated chamber 26, in which rotor 14 and flow distributor 18 are mounted. By "elongated" it is meant that the length of the chamber 26 is longer than the diameter of the chamber 26. Two end caps 13, only one of which is shown in FIG. 1, attach at opposite ends of housing 12. Thus, chamber 26 is a fluid-tight enclosure except for the first fluid injector passage 17 extending through first fluid inlet nozzle 16, the second fluid injection channel 21 extending to and through block 20, and the linear fluid discharge shown as spray holes 22 in FIG. 1. Instead of individual, linearly aligned orifices such as spray holes 22, the linear fluid discharge may comprise, for example, a single, thin slot (not shown).

Typically, a first fluid, for example an incompressible fluid such as water, enters chamber 26 in housing 12 of fluid head 10 through first fluid injector passage 17. A second fluid, for example a compressible fluid such as compressed air, may enter chamber 26 in housing 12 of fluid head 10 through second fluid inlet passage 21. The first fluid (in combination with the second fluid, when present) turns rotor 14 on the spindle 24 in chamber 26 and is discharged from chamber 26 out spray holes 22.

As shown in FIGS. 1 and 2, rotor 14 is cylindrical in shape and has vanes 30 with grooves 32 between each pair of vanes 30. Rotor 14 turns clockwise on spindle 24 as indicated by arrow A in FIG. 2. Preferably, vanes 30 are curved such that they have somewhat rounded leading edges 31 and pointed trailing edges 33. The back sides 37 of vanes 30 together with grooves 32 form a recess 34 having a J-shaped cross-section, or a reverse-J-shaped cross-section as shown in FIG. 2, depending on which end of rotor 14 one views the cross-section. The J-shaped recess 34 catches the fluid and rotates rotor 14 by allowing transfer of momentum from the fluid to rotor 14. Other standard rotor cross-sectional designs such as, for instance, L-shaped cross-sections or typical pump impeller cross-sectional designs known in the art may also be used.

The first fluid impinges upon each groove 32 in a first position in which groove 32 is aligned with the injection channel 50. The impinging force of the first fluid rotates rotor 14 to a second position aligned with spray holes 22, where the first liquid discharges from all spray holes 22 simultaneously. When a second fluid is provided, the second fluid enters groove 32 in an intermediate position of rotor 14 between the first and second positions and also discharges from spray holes 22 along with the first fluid.

First fluid inlet nozzle 16 as shown in FIGS. 1 and 2 has interior threads 40 that enable connection of a standard threaded connector. First fluid inlet nozzle 16 may also be outfitted with other connection fittings known in the art, such as quick-connect fittings, flanges, and the like, depending on the type of connection fitting on the source of the first fluid. Fluid passing through first fluid injector passage 17 enters into the fluid equalization zone 42 of chamber 26 in housing 12. In fluid equalization zone 42, the first fluid spreads outward longitudinally from first fluid inlet nozzle 16 toward end caps 13 so that the first fluid completely fills fluid equalization zone 42.

From fluid equalization zone 42, fluid then flows along arrow B over flow distributor 18 into flow injection channel 50 and into groove 32 of rotor 14, as shown in FIG. 2. Flow distributor 18 comprises a distributor plate 44 held in place against the walls of chamber 26 by the gussets 46. Gussets 46 have one or more notches 48 that allow fluid to flow from one side of gusset 46 to the other. Although shown with two notches 48 having a triangular cross section in FIGS. 1 and 2, gussets 46 may have any number of notches of any cross-sectional geometry, as desired. Flow distributor 18 guides the first fluid into flow injection channel 50 between distributor plate 44 and chamber 26. Flow injection channel 50 acts as a nozzle to accelerate the fluid into a thin, high-velocity sheet that impinges upon groove 32 of rotor 14. This sheet of fluid (not shown) provides, as created by flow distributor 18, a concentrated and directed stream along the outermost diameter of rotor 14, such that torque is maximized for turning rotor 14. Other flow distributor designs may be used. Fluid head designs with integral flow distributors or without discrete flow distributors may also be used.

Optional second fluid inlet block 20 provides an inlet connection for a second fluid to enter chamber 26. Just as the first fluid impinges upon rotor 14 such that torque is created to turn rotor 14 in the direction of arrow A as shown in FIG. 2, the second fluid also impinges upon rotor 14 to provide additional torque. Thus, the second fluid entering chamber 26 through second fluid injection channel 21 further accelerates rotor 14. Second fluid injection channel 21 cuts through housing 12 as well as through second fluid inlet block 20. Second fluid injection channel 21 may have a trapezoidal shape or pyramidal shape such that the second fluid is directed outwardly toward end caps 13 from second fluid injection channel 21 (as shown in FIG. 1). In the alternative, second fluid injection channel 21 may simply be a rectangular slot that impinges upon only a limited portion of rotor 14. Second fluid inlet block 20 also has a connector port 60 that may be connected to second fluid source (not shown). Connector port 60 may be any type of connector known in the art, such as a flanged connection (as shown in FIGS. 1 and 3), a quick connect, or a threaded coupling.

Rotor 14 spins on spindle 24, which is secured into recesses 52 in end caps 13. Recesses 52 typically penetrate partially, rather than completely, through end caps 13. Spindle 24 preferably comprises a standard bearing known in the art that enables low-friction rotation of rotor 14. End caps 13 may be connected to housing 12 by screws or pins (not shown) through mounting holes 53, or may be secured with adhesive. Similarly, second fluid inlet block 20 and first fluid inlet nozzle 16 may be secured to housing 12 with adhesive. Flow distributor 18 may merely rest in place as a function of its shape and the geometry of chamber 26.

In one exemplary application for fluid head 10, the first fluid may be warm or hot (greater than 120° F., for example) water at standard tap pressure (0 to 20 psig, for example) and the second fluid may be compressed air (0 to 50 psig, for example). For such an application, the components of the device may comprise chlorinated polyvinyl chloride (CPVC) or other thermoplastic resins capable of withstanding the temperatures and pressures, such as Lexan® polycarbonate resin, manufactured by the General Electric Company. The pressures and temperatures of the fluid, as well as the materials of construction of fluid head 10, are not limited to those listed above nor are these parameters critical to the functionality of fluid head 10. Such properties are dependent upon the type of cleaning desired and the fluids used for such cleaning, which are specific to each particular application.

Figure 3:
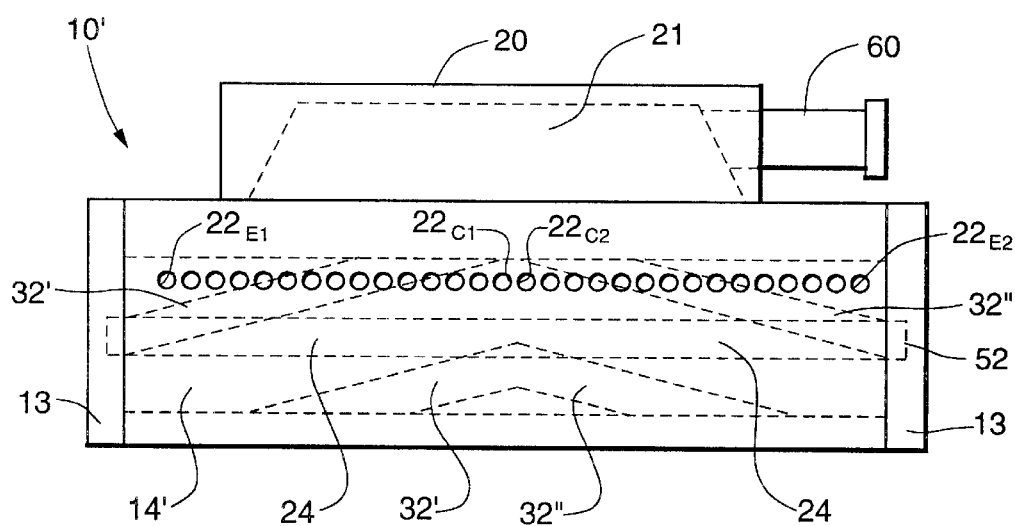
FIG. 3 is a bottom view of an exemplary fluid delivery device of the present invention (assembled), having a rotor with helical grooves shown with dashed lines.

Spray holes 22 as shown in FIGS. 1 and 3 are aligned in a linear pattern. Spray holes 22 may be a single line of, for example, $\frac{1}{16}$-inch holes spaced $\frac{1}{8}$ inch on center, or may be provided in any size and pattern selected to provide a desired linear spray pattern. If more than one line of spray holes 22 is used, however, it is desirable that all such lines of holes be aligned beneath a single groove 32 in at least one rotational position of rotor 14. In this way, the fluid discharge from groove 32 can be evenly distributed from the multiple lines, although the first line of spray holes 22 swept by trailing edge 33 will experience a slightly higher pressure in groove 32 than any subsequent line of spray holes 22 swept by trailing edge 33. Instead of a line of spray holes 22 having a round cross-section, the linear fluid discharge from housing 12 may comprise a single rectangular slot or a series of slits, a series of nozzles, or any other type of fluid exit known in the art. The linear configuration, whether as a single slot or linearly aligned holes, provides a sheet or curtain of fluid that covers a wide area of an object as the object is passed underneath fluid head 10 perpendicular to the linear fluid discharge.

As shown in the exemplary embodiment in FIG. 1, rotor 14 may comprise a plurality of grooves 32 parallel to spindle 24. In another exemplary embodiment, shown in FIG. 3 in dashed lines inside fluid head 10', the rotor 14' may comprise a plurality of helical grooves 32' and 32". Helical grooves 32' and 32" may traverse rotor 14' from end to end in the same direction or, as shown in FIG. 3, may traverse rotor 14' in opposite directions—one clockwise and one counterclockwise—along different portions of the length of rotor 14'. Thus, for instance, viewing rotor 14' from the side of fluid head 10' from which connector port 60 protrudes, clockwise rotation of rotor 14' will produce sequential pulses beginning at center spray holes $22_{C1}$ and $22_{C2}$ and progressing toward end spray holes $22_{E1}$ and $22_{E2}$, respectively.

In the alternative, rotor 14' may have all counterclockwise helical grooves 32' along its entire length, in which case the sequential pulses will travel from end spray hole $22_{E2}$ to end spray hole $22_{E1}$. Similarly, all clockwise helical grooves 32" will produce sequential pulses traveling from end spray hole $22_{E1}$ to end spray hole $22_{E2}$. Also, clockwise helical grooves 32" may be aligned between center spray hole $22_{C1}$ and end spray hole $22_{E1}$ and counterclockwise helical grooves 32' may be aligned between center spray hole $22_{C2}$ and end spray hole $22_{E2}$ such that the sequential pulses progress from end spray holes $22_{E1}$ and $22_{E2}$ inward to center spray holes $22_{C1}$ and $22_{C1}$, respectively.

Figure 4:
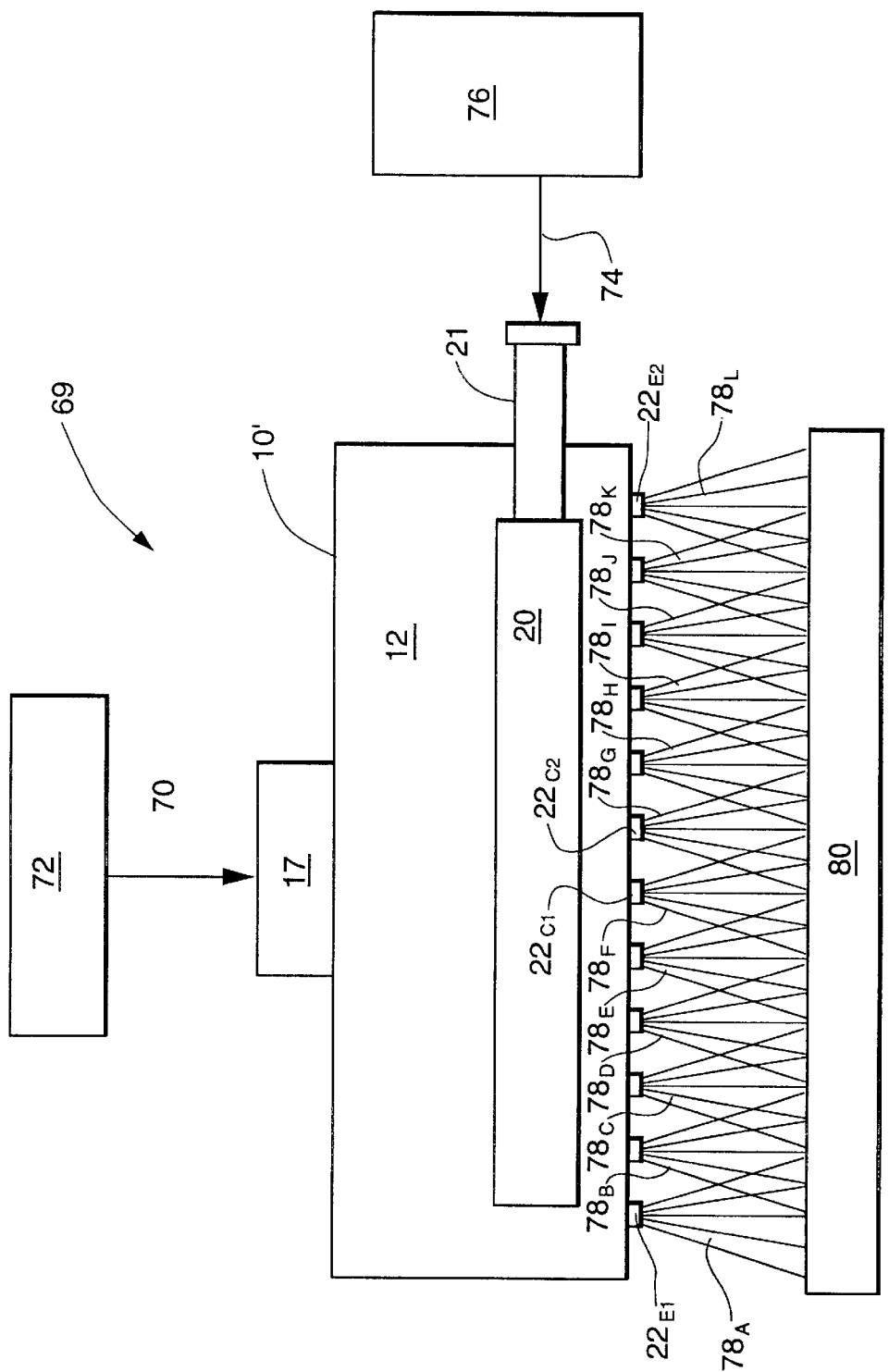
FIG. 4 is a schematic diagram of an exemplary fluid delivery device incorporated into a cleaning system being used in an exemplary method for cleaning an object.

Fluid head 10' of the present invention may be a part of a cleaning system 69, as shown schematically in FIG. 4, that also comprises a first fluid 70 and a source 72 of first fluid 70 attached to fluid head 10'. Optionally, system 69 also comprises a second fluid 74 and a source 76 of the second fluid attached to fluid head 10'. First fluid 70 and second fluid 74 may both be the same fluid or different fluids. Both may be incompressible fluids, such as first fluid 70 comprising water and second fluid 74 comprising a surfactant to be mixed with the water, or one fluid may be incompressible and the other compressible. One or both of the fluids 70, 74 may be a chemical-based or a petroleum-based solvent; may have an acidic, neutral, or caustic pH; or may have both such characteristics.

In one configuration, first fluid 70 is hot water and second fluid 74 is compressed air, although the fluids may be reversed. The mixture of compressible and incompressible fluids has a higher energy per unit volume of incompressible fluid than if no compressible fluid were present. A fluid head having a single fluid inlet and a mix of compressible and incompressible fluids entering through that single fluid inlet may also achieve similar energy per unit volume.

The higher energy per unit volume resulting from the compressible-incompressible fluid mixture translates to a higher velocity jet of incompressible fluid impinging upon the surface to be cleaned. This result is due to the expansion of the compressible fluid when it enters chamber 26, which is typically at a lower pressure than the compressed fluid source. As the compressible fluid expands in the fixed volume of chamber 26, it increases the overall velocity of the gas-liquid mixture, resulting in a higher exit velocity from the fluid discharge. The higher velocity fluid impinging upon the surface to be cleaned carries more energy and thus creates a higher dynamic pressure upon impact, providing more cleaning power.

The fluid head cleaning system 69 shown in FIG. 4 may be used to carry out a method of cleaning. The method comprises injecting first fluid 70, such as water, into first fluid injector passage 17 through injection channel 50 to chamber 26 where the fluid rotates rotor 14 (channel 50, chamber 26, and rotor 14 are shown in FIG. 2). Then pulse or pulses $78_{A-L}$ of first fluid 70 are discharged through spray holes 22 and onto the object 80, which may be a circuit board. As shown in FIG. 4, the fluid head cleaning system 69 may further comprise second fluid 74, such as compressed air, and source 76 of second fluid 74 connected to second fluid inlet channel 21. In this case, the method further comprises injecting second fluid 74 into groove 32 of rotor 14 (groove 32 and rotor 14 are shown in FIG. 2) and discharging second fluid 74 from fluid spray holes 22 along with first fluid 70.

Fluid head 10' of fluid head cleaning system 69 may have a rotor 14' with helical grooves 32' such as is shown in FIG. 3. In this case, the method further comprises rotating helical grooves 32' into alignment with sequential portions of the plurality of spray holes 22 and providing pulses of fluid sequentially from spray holes 22. For example, the fluid pulses may start at center spray holes $22_{C1}$ and $22_{C2}$ and end at end spray holes $22_{E1}$ and $22_{E2}$, respectively, located at the opposite ends of housing 12. Thus, pulses $78_F$ and $78_G$ spray simultaneously, followed by simultaneous pulses $78_E$ and $78_H$, $78_D$ and $78_I$, $78_C$ and $78_J$, $78_B$ and $78_K$, and $78_A$ and $78_L$ then spraying sequentially. The sequence then begins again with pulses $78_F$ and $78_G$ as the next helical groove 32' comes around and discharges fluid.

In an alternative embodiment, pulses $78_{A-L}$ may start with simultaneous pulses $78_A$ and $78_L$ at end spray holes $22_{E1}$ and $22_{E2}$, respectively, and end with pulses $78_F$ and $78_G$ at center spray holes $22_{C1}$ and $22_{C2}$, respectively. In yet another alternative embodiment, the sequence may start with a single pulse $78_A$ and end with a single pulse $78_L$, or conversely start with pulse $78_L$ and end with pulse $78_A$.

Although the various pulse patterns resulting from various rotor groove designs are illustrated above with respect to a linear fluid discharge comprising a plurality of individual fluid spray holes 22 aligned in a line, similar pulse patterns may also be produced from a single slot discharge. In that case, rather than discrete pulses $78_{A-L}$ emanating from each spray hole 22 in sequence, the single pulse corresponding to one groove 32 of rotor 14 exiting through the fluid discharge will travel from end to end, from both ends to the center, or from the center to both ends, accordingly.

Although illustrated and described above with reference to certain specific embodiments, the present invention is nevertheless not intended to be limited to the details shown. Rather, various modifications may be made in the details within the scope and range of equivalents of the claims and without departing from the spirit of the present invention.

What is claimed:

1. A fluid delivery device for supplying a linear pulsating discharge of a first fluid from a source of the first fluid, comprising:
   a housing;
   an elongated cylindrical chamber within the housing, the chamber having an inside diameter and a length, the length being greater than the inside diameter;
   an elongated cylindrical rotor rotatably mounted in the chamber, the rotor having an outside diameter sized to substantially wipe the inside diameter of the chamber and having a plurality of grooves;
   a first fluid injector passage in the housing connected to the first fluid source and to the chamber, the first fluid injector passage comprising a first fluid injection channel shaped to accelerate the first fluid entering the first fluid injector passage and to direct the accelerated first fluid into the grooves of the rotor, causing the rotor to rotate; and
   a linear fluid discharge nozzle in the housing connected to the chamber, the discharge nozzle, as a whole, comprising a linear structure for ejecting a linear pulsating stream of the first fluid from the device, the linear pulsating stream essentially extending across the entire length of the elongated chamber.

2. The device of claim 1 wherein the grooves have a J-shaped cross section.

3. The device of claim 1 wherein the first fluid injection channel is adapted to inject the first fluid into the grooves of the rotor approximately at the outside diameter of the rotor.

4. The device of claim 1 wherein the linear fluid discharge nozzle comprises a plurality of individual linearly-aligned orifices.

5. A method for cleaning an object using the device of claim 1, the method comprising,
   a) passing the first fluid into the first fluid injector passage and into the first fluid injection channel;
   b) impinging the first fluid upon the grooves in the rotor, thereby rotating the rotor; and
   c) ejecting the linear pulsating stream of the first fluid through the linear fluid discharge nozzle onto the object.

6. The device of claim 1, wherein the device is adapted for cleaning a circuit board-having a width, the linear pulsating stream having a width sufficient to cover the circuit board width.

7. A fluid delivery device for supplying a linear pulsating discharge of a first fluid from a source of the first fluid, comprising:
   a housing;
   an elongated cylindrical chamber within the housing, the chamber having an inside diameter and a length, the length being greater than the inside diameter;
   an elongated cylindrical rotor rotatably mounted in the chamber, the rotor having an outside diameter sized to substantially wipe the inside diameter of the chamber and having a plurality of helical grooves;
   a first fluid injector passage in the housing connected to the first fluid source and to the chamber, the first fluid injector passage comprising a first fluid injection channel shaped to accelerate the first fluid entering the first fluid injector passage and to direct the accelerated first fluid into the grooves of the rotor, causing the rotor to rotate; and
   a linear fluid discharge nozzle in the housing connected to the chamber, the discharge nozzle adapted to eject a linear pulsating stream of the first fluid from the device;
   wherein the grooves are aligned with one linear portion of the linear fluid discharge nozzle in one position of the rotor and aligned with another linear portion of the linear fluid discharge nozzle in another position of the rotor, the helical grooves adapted to provide a pulse of fluid that traverses the linear fluid discharge nozzle from the one linear portion to the other linear portion upon rotation of the rotor from the one to the other position.

8. The device of claim 7 further comprising a first helical groove disposed in a clockwise helix and aligned with a first section of the linear fluid discharge nozzle and a second helical groove disposed in a counter-clockwise helix aligned with a second section of the linear fluid discharge nozzle.

9. The device of claim 8 wherein the rotor has a length and the first helical groove is positioned along a first portion of the length and the second helical groove is positioned along a second portion of the length.

10. A fluid delivery device for supplying a linear pulsating discharge of a first fluid from a source of the first fluid, comprising:
    a housing;
    an elongated cylindrical chamber within the housing, the chamber having an inside diameter and a length, the length being greater than the inside diameter;
    an elongated cylindrical rotor rotatably mounted in the chamber, the rotor having all outside diameter sized to substantially wipe the inside diameter of the chamber and having a plurality of grooves;
    first fluid injector passage in the housing connected to the first fluid source and to the chamber, the first fluid injector passage comprising a first fluid injection channel shaped to accelerate the first fluid entering the first fluid injector passage and to direct the accelerated first fluid into the grooves of the rotor, causing the rotor to rotate;
    second fluid injection channel in the housing connected to a source of a second fluid, the second fluid injection channel adapted to inject the second fluid into the grooves of the rotor; and
    a linear fluid discharge nozzle in the housing connected to the chamber, the discharge adapted to eject a linear pulsating stream of the first fluid and the second fluid from the device.

11. The device of claim 10 wherein one of the first and second fluids is a compressible fluid and the other of the first and second fluids is an incompressible fluid.

12. The device of claim 11 wherein the incompressible fluid comprises water and the compressible fluid comprises compressed air.

13. The device of claim 12 wherein the compressed air has a pressure in a range of 1 to 50 pounds per square inch gauge.

14. The device of claim 12 wherein the water has a temperature greater than 120° F.

15. A method for cleaning an object using a fluid delivery device for supplying a linear pulsating discharge of a first fluid from a source of the first fluid, the device having a housing; an elongated cylindrical chamber within the housing, the chamber having an inside diameter and a length, the length being greater than the inside diameter; an elongated cylindrical rotor rotatably mounted in the chamber, the rotor having an outside diameter sized to substantially wipe the inside diameter of the chamber and having a plurality of helical grooves; a first to fluid injector passage in the housing connected to the first fluid source and to the chamber, the first fluid injector passage comprising a first luid injection channel shaped to accelerate te first fluid e r the first flud injector passage and to direct the accelerated first fluid into the Prooves of tbe rotor, causn the rotor to rotate; a secod fluid ijectioll channel mi the housing connected to a source of a second fluid and a linear fluid discharge nozzle in the housing connected to the chamber, the nozzle adapted to eject a linear pulsating steam of the first fluid from dile device, the method comprising:

(a) passin the first fluid into the first fluid injector passage and into the first fluid inecdon channel;

(b) mingin the irstfluid upootthe grooves in the rotor, hereby rotating the rotor;

(c) ijectmg the second fluid into die second fluid injecuon channel and impinging the second fluid into the grooves in the rotor; and, (d) ejecting a pulse of the first fluid ad the second fluid through the linear discharge nozzle onto the object.

16. The method of claim 15 wherein one of the first and second fluids is incompressible and the other of the first and second fluids is compressible.

17. The method of claim 16 wherein the incompressible fluid is water and the compressible fluid is air.

18. The method of claim 15 wherein the linear fluid discharge nozzle has a first and a second end, the method further comprising, in step (c), providing the pulse starting the first end and ending at the second end.

19. The method of claim 15 wherein the object being cleaned is a circuit board.

20. A method for cleaning an object using a fluid delivery device for supplying a linear pulsating discharge of a first fluid from a source of the first fluid, the device having a housing; an elongated cylindrical chamber with the housing, the chamber having an inside diameter and a length, the length being greater than the inside diameter; and elongated cylindrical rotor rotatably mounted in the chamber, the rotor having an outside diameter sized to substantially wipe the inside diameter of the chamber and having a plurality of helical grooves; a first fluid injector passage in the housing connected to the first fluid source and to the chamber, the first fluid injector passage comprising a first fluid injection channel shaped to accelerate the first fluid entering the first fluid injector passage and to direct the accelerated first fluid into the grooves of the rotor, causing the rotor to rotate; and a linear fluid discharge nozzle in the housing connected to the chamber, the nozzle adapted to eject a linear pulsating stream of the first fluid from the device, each of the rotor grooves aligned with one linear portion of the linear fluid discharge nozzle in one position of the rotor and aligned with another linear portion of the linear fluid discharge nozzle in another position of the rotor, the method comprising:

(a) passing the first fluid into the first fluid injector passage and into the first fluid injection channel;

(b) impinging the first fluid upon the grooves in the rotor, thereby rotating the rotor;

(c) ejecting a pulse of the first fluid through the linear fluid discharge nozzle onto the object so that the pulse traverses the linear fluid discharge nozzle from the one linear portion to the other linear portion as the rotor rotates from the one to the other position.

21. The method of claim 20 wherein the linear fluid discharge nozzle comprises a plurality of individuals linearly aligned orifices in which the one linear portion comprises a first orifice and the other linear portion comprises a second orifice, the first and second orifices having a set of orifices linearly aligned therebetween, in which the method further comprises ejecting the first fluid in a pulse that sequences linearly from the fist orifice through the set of orifices to the second orifice.

22. The method of claim 20 wherein the linear fluid discharge nozzle has a center and two opposite ends, the method further comprising, in step (c), providing the pulse starting at the center and ending at the opposite ends.

23. The method of claim 20 wherein the linear fluid discharge nozzle has a center and two opposite ends, the method further comprising, in step (c), providing the pulse starting at the opposite ends and ending at the center.

* * * * *